US011824303B2

(12) United States Patent
Herron et al.

(10) Patent No.: US 11,824,303 B2
(45) Date of Patent: Nov. 21, 2023

(54) SPRING LOCK INTERFACE WITH INCREASED CABLE CAPACITY

(71) Applicant: Virginia Panel Corporation, Waynesboro, VA (US)

(72) Inventors: Randall Herron, Waynesboro, VA (US); Randall Garman, Grottoes, VA (US); David Lawrence Rocker, Earlysville, VA (US)

(73) Assignee: Virginia Panel Corporation, Waynesboro, VA (US)

( * ) Notice: Subject to any disclaimer, the term of this patent is extended or adjusted under 35 U.S.C. 154(b) by 42 days.

(21) Appl. No.: 17/400,954

(22) Filed: Aug. 12, 2021

(65) Prior Publication Data

US 2022/0052480 A1    Feb. 17, 2022

Related U.S. Application Data

(60) Provisional application No. 63/065,309, filed on Aug. 13, 2020.

(51) Int. Cl.
*H01R 13/627* (2006.01)
*H01R 13/621* (2006.01)
*G01R 1/04* (2006.01)
*H01R 13/512* (2006.01)
*H01R 13/639* (2006.01)
*H01R 43/26* (2006.01)

(52) U.S. Cl.
CPC ......... *H01R 13/621* (2013.01); *G01R 1/0416* (2013.01); *H01R 13/512* (2013.01); *H01R 13/639* (2013.01); *H01R 43/26* (2013.01)

(58) Field of Classification Search
CPC .. H01R 13/621; H01R 13/512; H01R 13/639; H01R 43/26; G01R 1/0416
USPC .......................................................... 439/359
See application file for complete search history.

(56) References Cited

U.S. PATENT DOCUMENTS

| | | | | |
|---|---|---|---|---|
| 5,993,255 A | * | 11/1999 | Yurko | H01R 13/631 439/364 |
| 6,824,405 B2 | * | 11/2004 | Hubbard | H01R 13/62933 439/465 |
| 6,882,138 B2 | * | 4/2005 | Langouet | G01R 1/0416 361/600 |
| 6,948,952 B2 | * | 9/2005 | Hubbard | H01R 13/62933 439/465 |
| 7,297,014 B1 | * | 11/2007 | Stowers | H01R 13/621 439/372 |
| D561,125 S | | 2/2008 | Stowers | |
| D617,666 S | * | 6/2010 | Stowers | D10/81 |

(Continued)

*Primary Examiner* — Abdullah A Riyami
*Assistant Examiner* — Vladimir Imas
(74) *Attorney, Agent, or Firm* — 24IP LAW GROUP USA, PLLC; Timothy DeWitt (57) ABSTRACT

A test adapter assembly for an interface. The test adapter assembly has a test adapter frame having a first pair of opposing sides, a second pair of opposing sides and an engagement mechanism support member, the second pair of opposing sides being shorter than the first pair of opposing side, the first and second pairs of opposing sides forming a test adapter face; and a collar support member, the collar support member having plate portion mounted to one of the second pair of opposing sides of the test adapter frame and a collar mounting portion extending from the plate portion at an angle of 40-50° relative to the face of the test adapter frame.

6 Claims, 13 Drawing Sheets

(56) References Cited

U.S. PATENT DOCUMENTS

| | | | | |
|---|---|---|---|---|
| 8,348,693 B2 * | 1/2013 | Stowers | ............... | H01R 12/727 |
| | | | | 439/364 |
| 8,469,732 B2 * | 6/2013 | Sen | ...................... | H01R 13/639 |
| | | | | 439/347 |
| 9,257,787 B2 * | 2/2016 | Stowers | ............... | H01R 13/629 |
| 10,826,235 B2 * | 11/2020 | Shain | ..................... | H01R 43/26 |
| D969,765 S * | 11/2022 | Herron | ......................... | D13/184 |
| 2018/0358735 A1 * | 12/2018 | Herron | ................. | H01R 13/514 |

* cited by examiner

SPRING LOCK INTERFACE WITH INCREASED CABLE CAPACITY

CROSS-REFERENCE TO RELATED APPLICATIONS

The present application claims the benefit of the filing date of U.S. Provisional Patent Application Ser. No. 63/065,309 filed by the present inventors on Aug. 13, 2020.

The aforementioned provisional patent application is hereby incorporated by reference in its entirety.

STATEMENT REGARDING FEDERALLY SPONSORED RESEARCH OR DEVELOPMENT

None.

BACKGROUND OF THE INVENTION

Field of the Invention

The present invention relates to an apparatus for securing and locking interfaces of two items releasably together and more particularly to an apparatus for securing and locking together an array of electrical connectors in a common frame.

Brief Description of the Related Art

U.S. Pat. No. 7,297,014 discloses an interface device having a receiver and tester adapter and an engagement system to initially attach the receiver and test adapter together. After initial attachment, the use of a multi start Acme lead screw provides a, consistent, low torque means of engagement. Although the engager requires the use of lubrication, to be applied initially, the lube is contained in a sealed environment. This eliminates the risk of contamination to electrical components and eliminates the need to apply additional lube during the products life. Because the present invention allows the ACME threads to be "meshed" at all times, it also eliminates the possibly of cross-threading. The test adapter in the system has a frame, a plate, a collar, a cover, and a handle. A wiring bundle or wires can extend through the collar and be connected to contact pins in the test adapter frame. The angle of the opening in the collar relative to the frame is approximately 30 degrees.

SUMMARY OF THE INVENTION

In a preferred embodiment, the present invention is a test adapter assembly for an interface. The test adapter assembly has a test adapter frame having a first pair of opposing sides, a second pair of opposing sides and an engagement mechanism support member, the second pair of opposing sides being shorter than the first pair of opposing side, the first and second pairs of opposing sides forming a test adapter face; a collar support member, the collar support member having plate portion mounted to one of the second pair of opposing sides of the test adapter frame and a collar mounting portion extending from the plate portion at an angle of 40-50° relative to the face of the test adapter frame; and a collar.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature and not as restrictive. Additional objects and advantages of the invention will be set forth in part in the description which follows and in part will be obvious from the description or may be learned by practice of the invention.

BRIEF DESCRIPTION OF THE DRAWINGS

For a more complete understanding of the present invention and the advantages thereof, reference is now made to the following description and the accompanying drawings, in which.

DETAILED DESCRIPTION OF THE PREFERRED EMBODIMENTS

A preferred embodiment of the present invention is described with reference to FIGS. 1A-9. An engagement system in accordance with the present invention has a test adapter assembly 100 and a receiver 200 (see FIG. 9).

Figure 9:
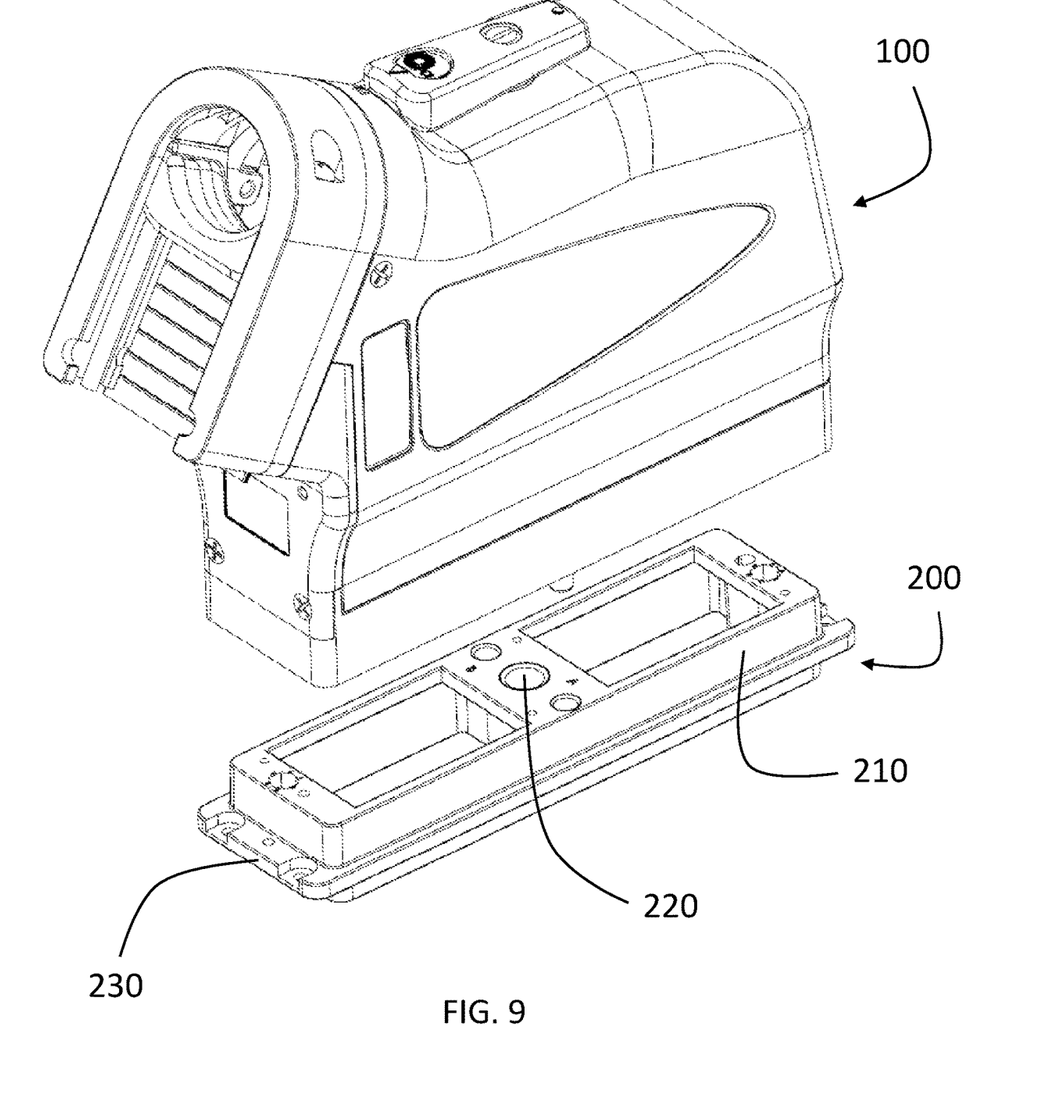
FIG. 9 is a perspective view of an interface device in accordance with a preferred embodiment of the present invention.

The receiver 200 has a frame 210 having mounting members 230 on each end and an opening 220 in which there is a spring lock bushing (not shown).

The test adapter assembly 100, shown in FIGS. 1A-7, has a test adapter frame 110, a collar support plate 120, a collar 130, a cover 140 and a handle 150. The test adapter frame 110 is in the shape of a rectangle having two pairs of opposing sides with one pair being shorter than the other pair. On the each of the pair of long sides is a pair of grooves 110a for use in releasably attaching the cover 140 to the frame 110 via a tongue 142. The test adapter frame 110 further has an engagement mechanism support member 113 parallel to the shorter pair of opposing sides and between the longer pair of opposing sides and may have means such as holes for mounting modules or connectors (not shown) to the frame 110. The engagement member support member 113 additionally has alignment pin bushings (not shown) for receiving a pair of guide pins 830 and a spring lock bushing 115 for receiving a spring lock pin 840 of an engagement mechanism 800.

The collar support plate 120 has a pair of holes 124 through which, for example, screws 125 may be placed to secure the collar support plate 120 to one of the short sides of the frame 110. While screws are used in a preferred embodiment, any means for attaching may be used to attach the collar support plate 120 to the frame 110. The collar support plate 120 may have additional features such as a recess 121 for placement of a label.

The collar 130 is attached to the collar support plate 120 via, for example, screws 131 through holes 135. The collar 130 has a clamp 132 that slides within a pair of grooves 133, one on each of two sides of the collar 130. When in use, patchcords (not shown) go through the collar to pins mounted in the test adapter frame 110. The clamp 132 may be tightened around the patch cords (not shown) via, for example, screws 136. A cover 134 can slide up or down to cover any portion of the opening in the collar 130 that remains open once the wiring bundle is installed. The cover prevents dust or other contaminants from entering the test adapter was it is fully assembled.

Figure 1A:
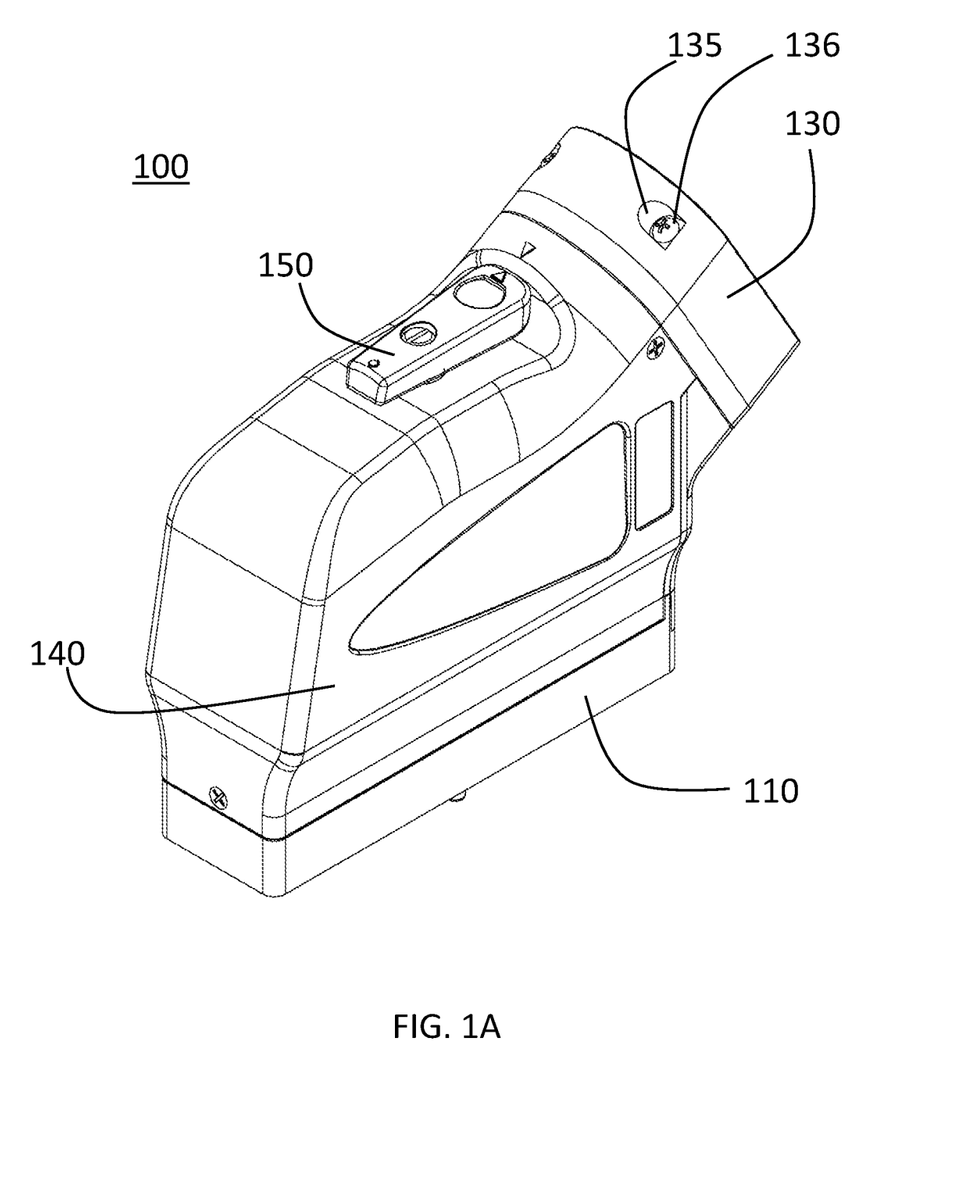
FIG. 1A is a top front left side perspective view of a test adapter in accordance with a preferred embodiment of the present invention.
Figure 1B:
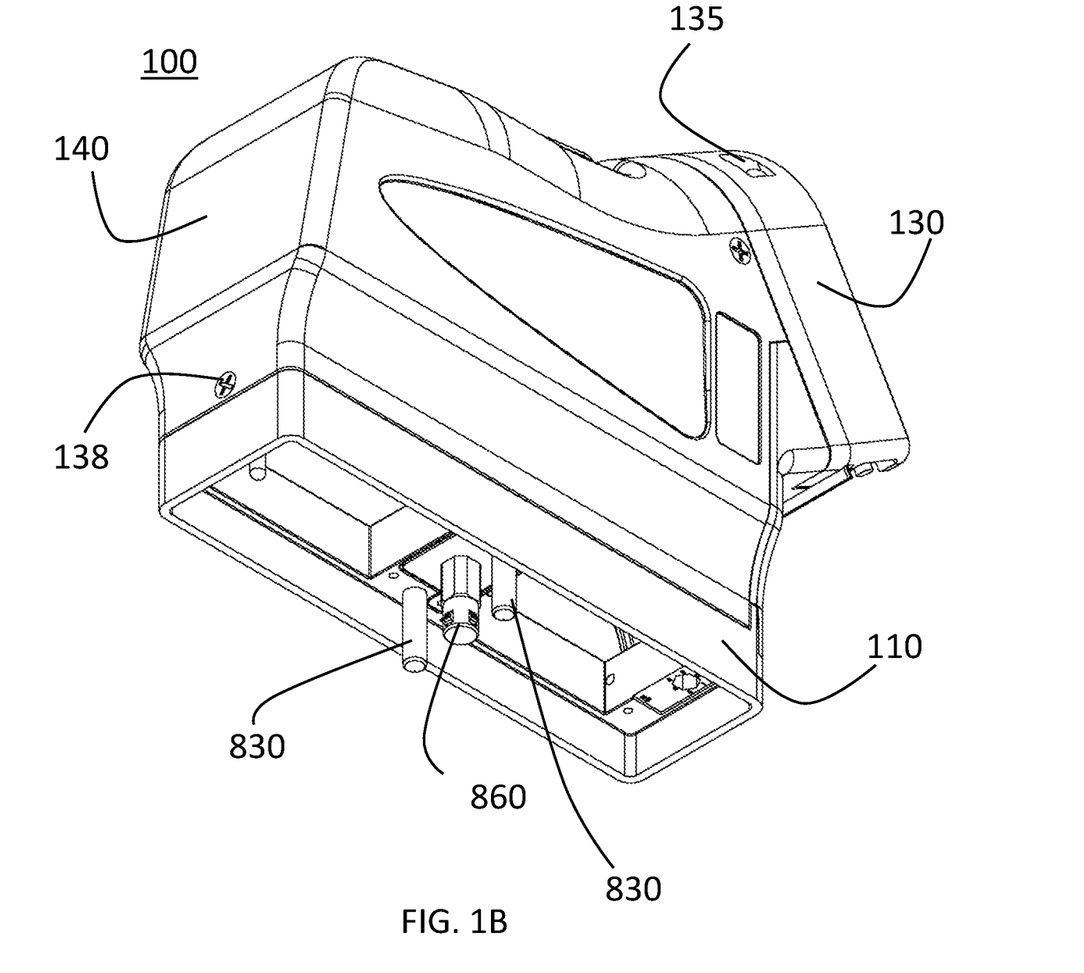
FIG. 1B is a bottom front left side perspective view of a test adapter in accordance with a preferred embodiment of the present invention.
Figure 1C:
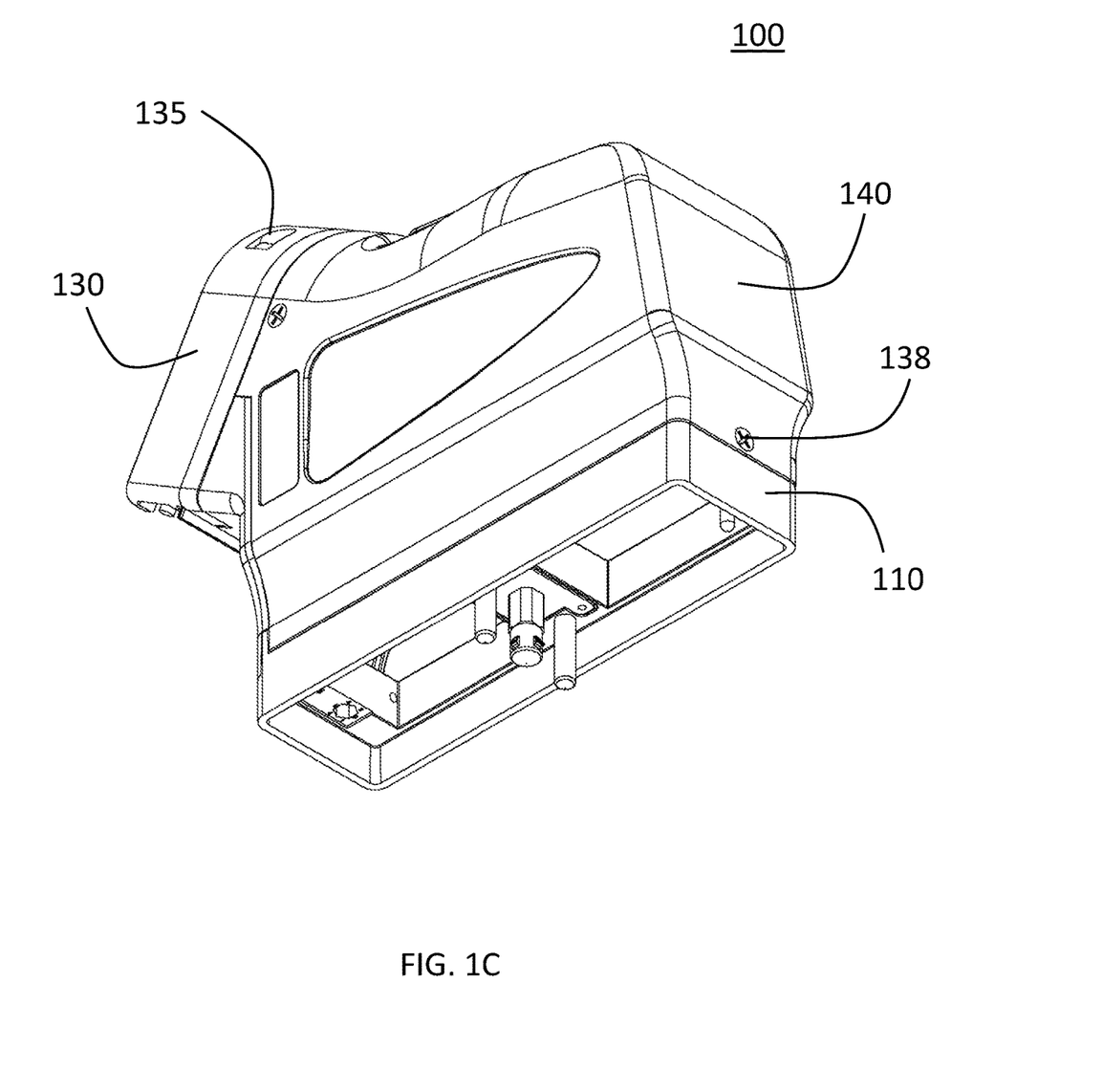
FIG. 1C is a bottom front right-side perspective view of a test adapter in accordance with a preferred embodiment of the present invention.
Figure 1D:
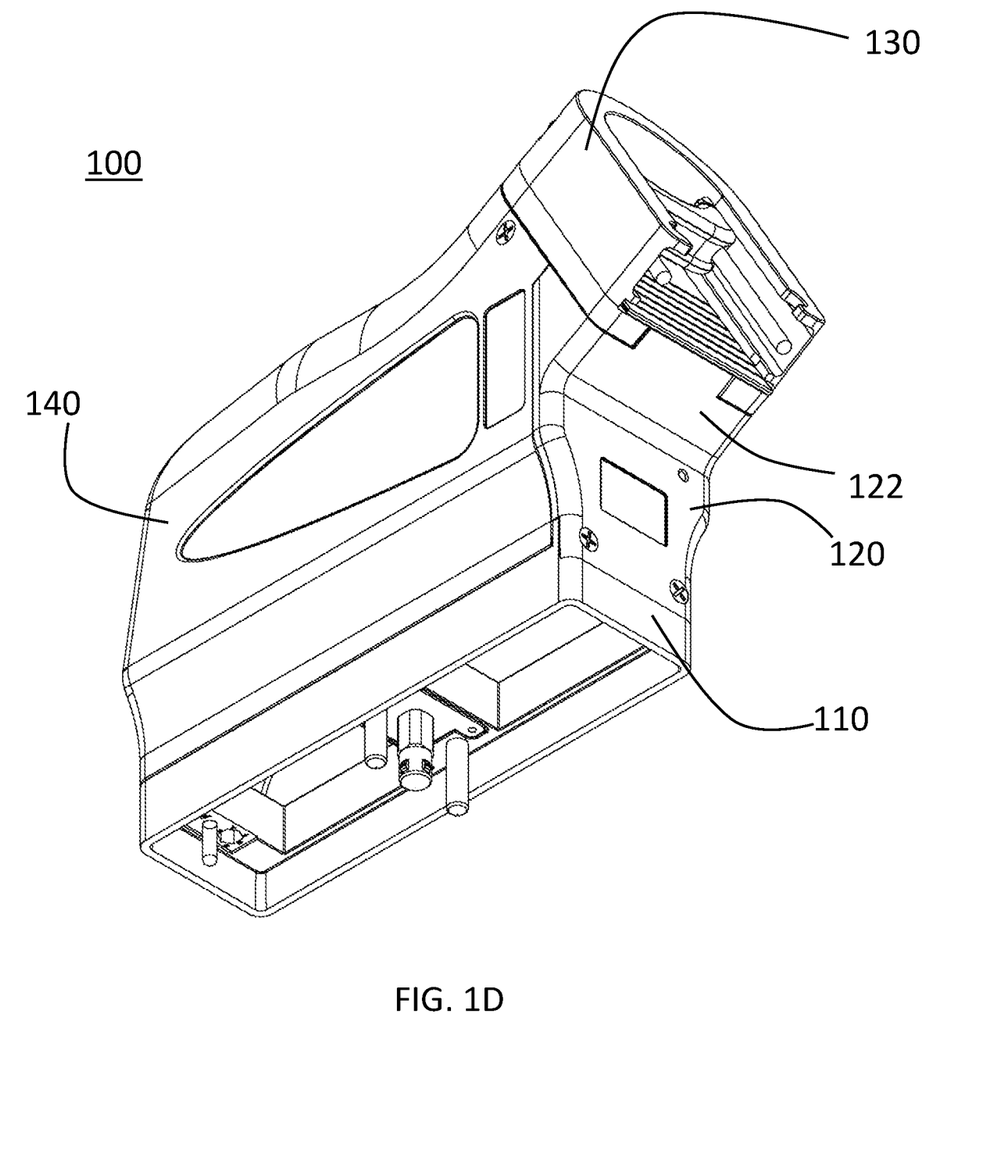
FIG. 1D is a bottom rear left side perspective view of a test adapter in accordance with a preferred embodiment of the present invention.
Figure 1E:
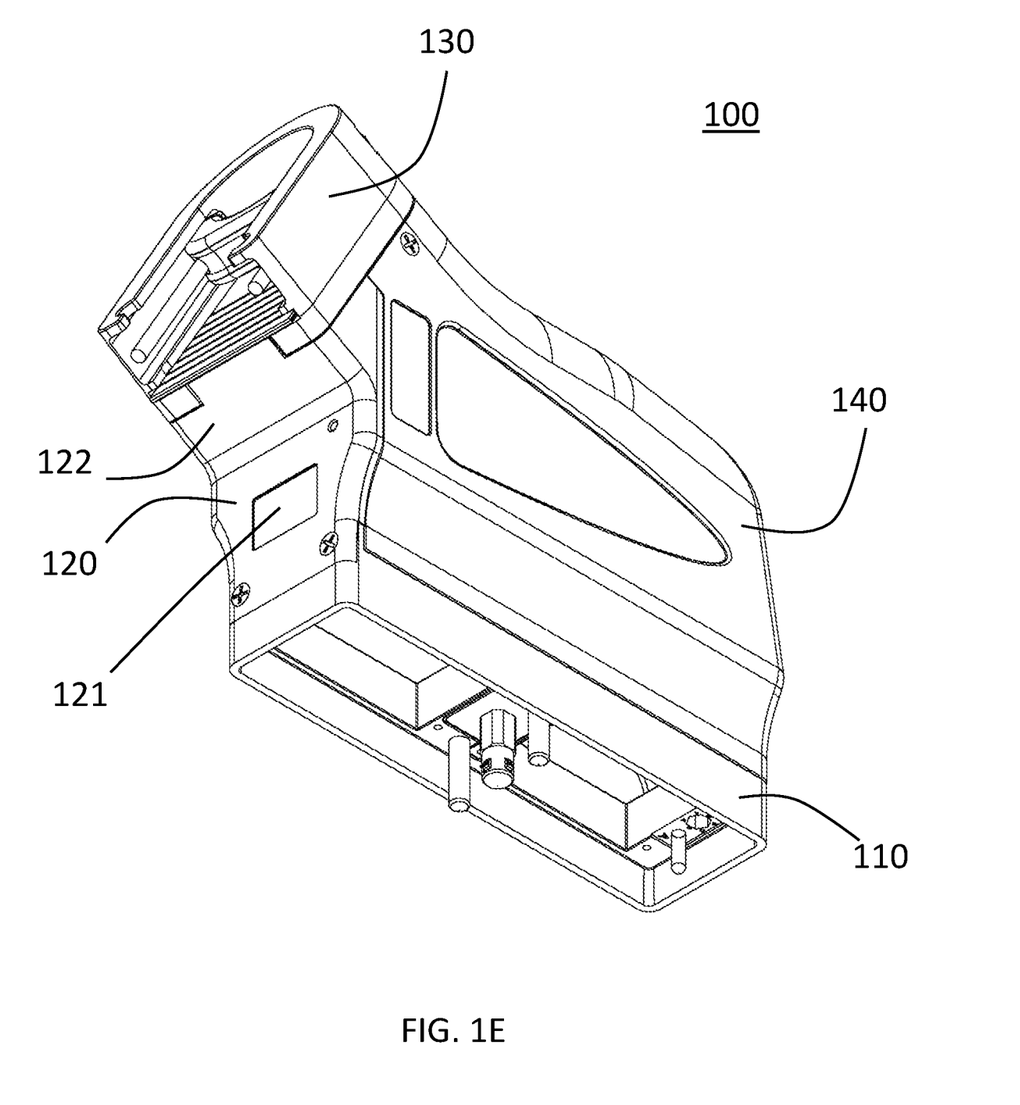
FIG. 1E is a bottom rear right side perspective view of a test adapter in accordance with a preferred embodiment of the present invention.
Figure 1F:
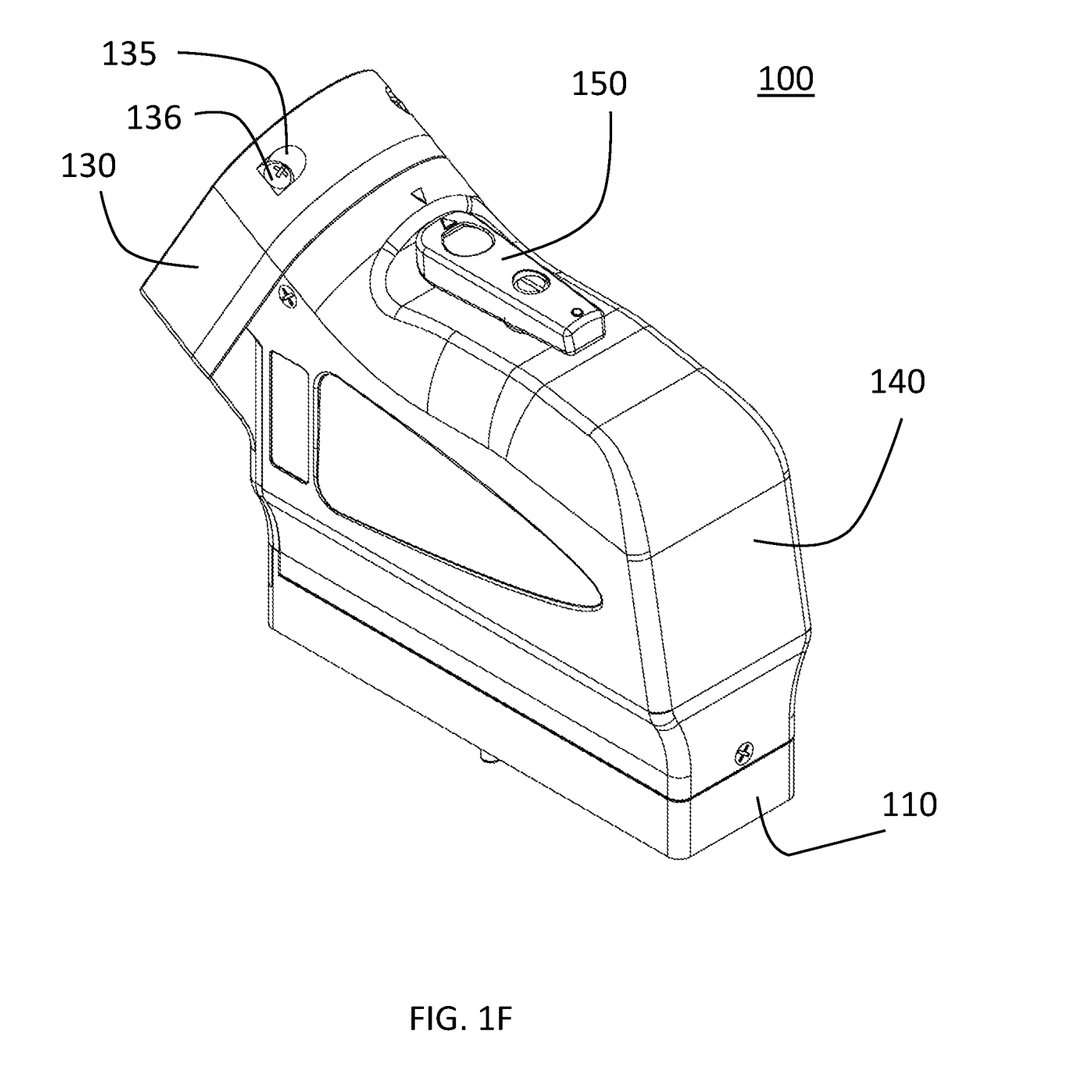
FIG. 1F is a top front right-side perspective view of a test adapter in accordance with a preferred embodiment of the present invention.
Figure 1G:
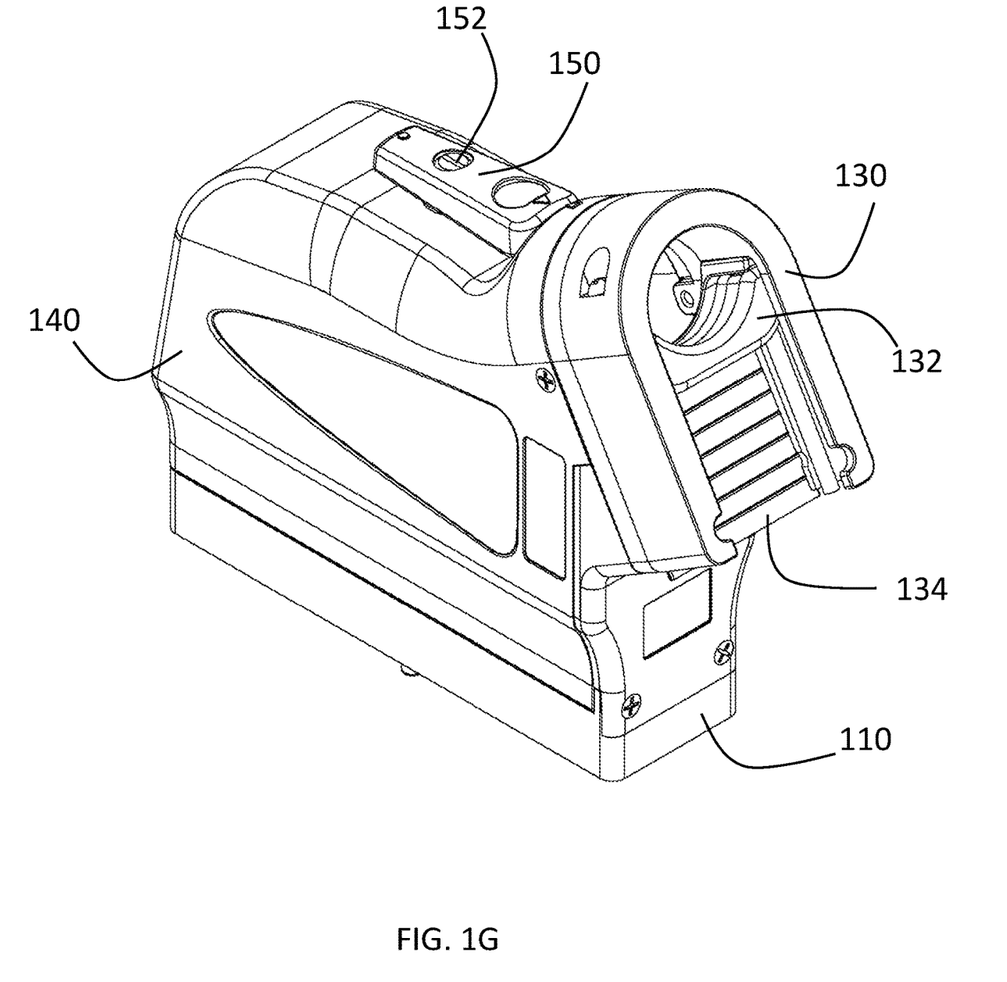
FIG. 1G is a top rear left side perspective view of a test adapter in accordance with a preferred embodiment of the present invention.
Figure 1H:
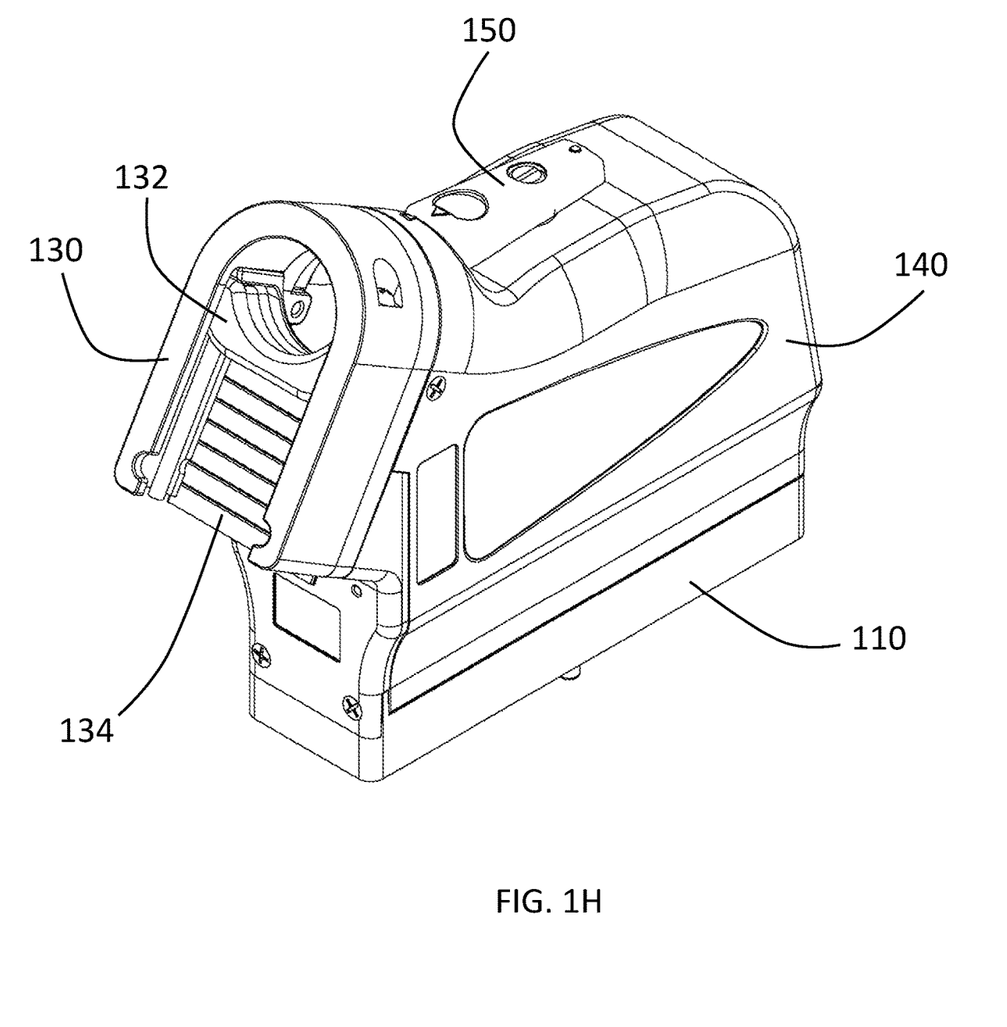
FIG. 1H is a top rear right side perspective view of a test adapter in accordance with a preferred embodiment of the present invention.
Figure 2:
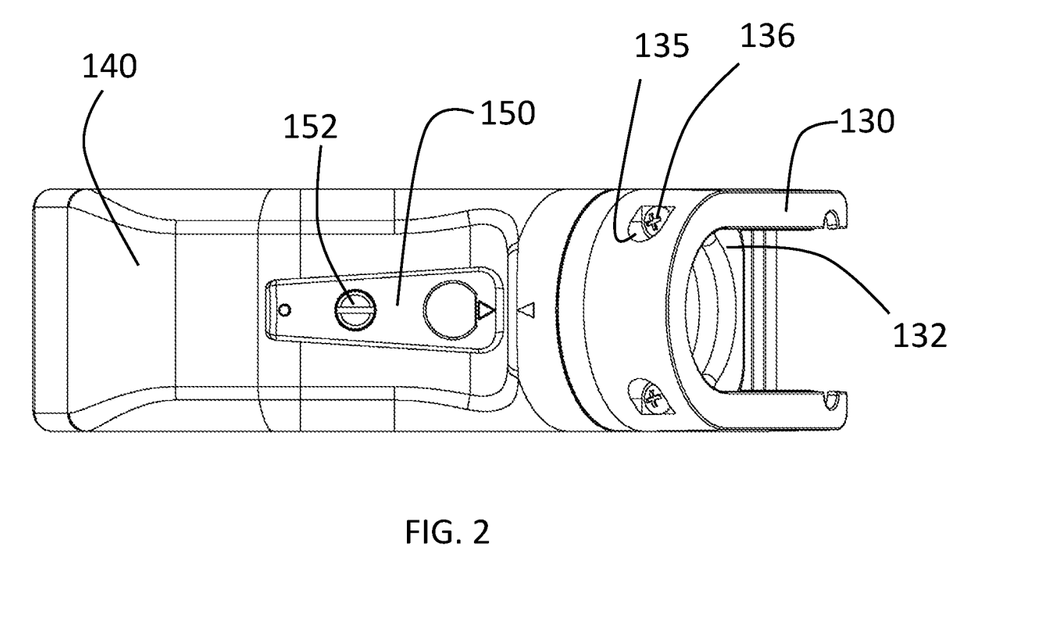
FIG. 2 is a top view of a test adapter in accordance with a preferred embodiment of the present invention.
Figure 3:
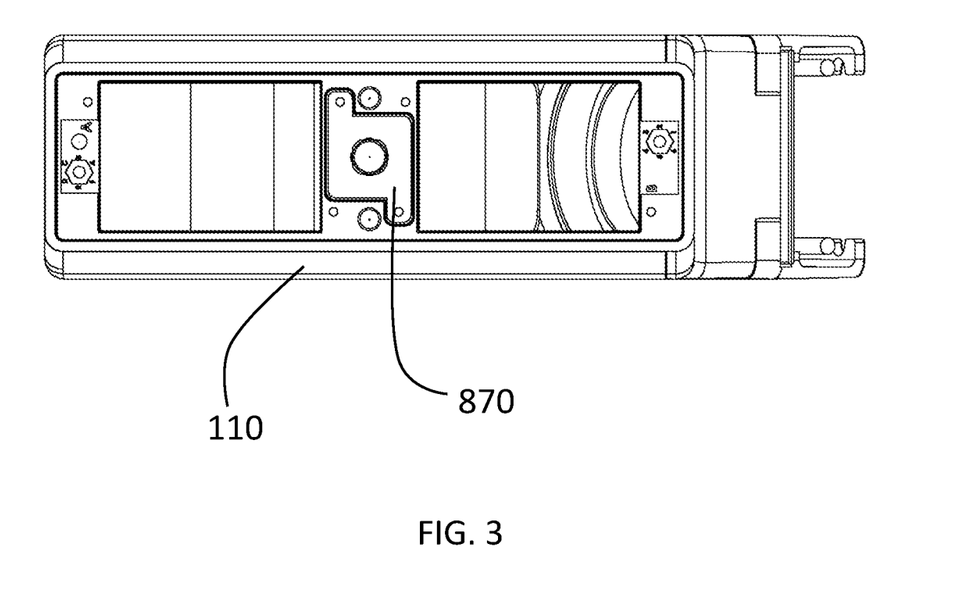
FIG. 3 is a bottom view of a test adapter in accordance with a preferred embodiment of the present invention.
Figure 4:
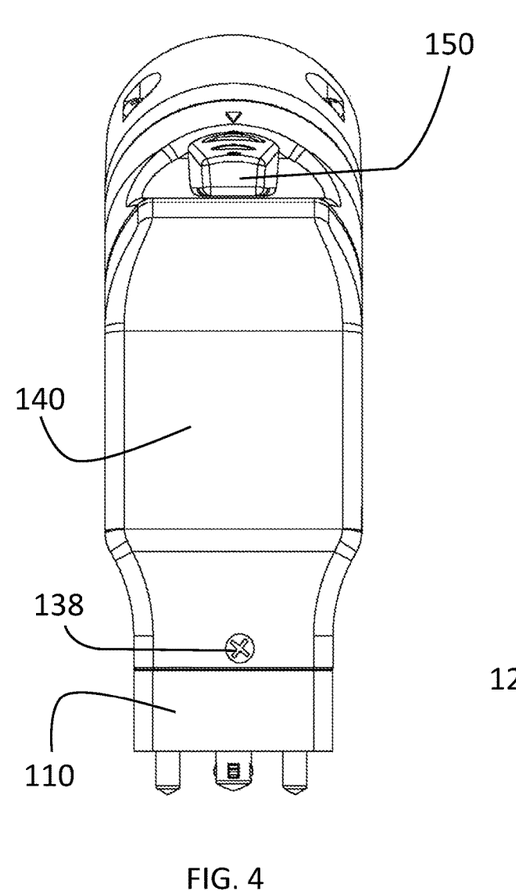
FIG. 4 is a front view of a test adapter in accordance with a preferred embodiment of the present invention.
Figure 5:
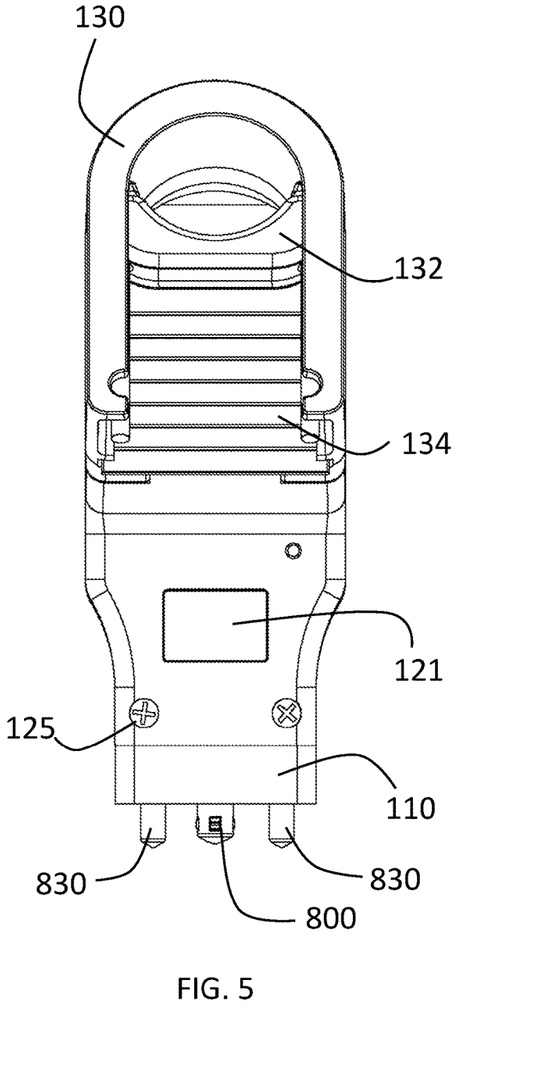
FIG. 5 is a rear view of a test adapter in accordance with a preferred embodiment of the present invention.
Figure 6:
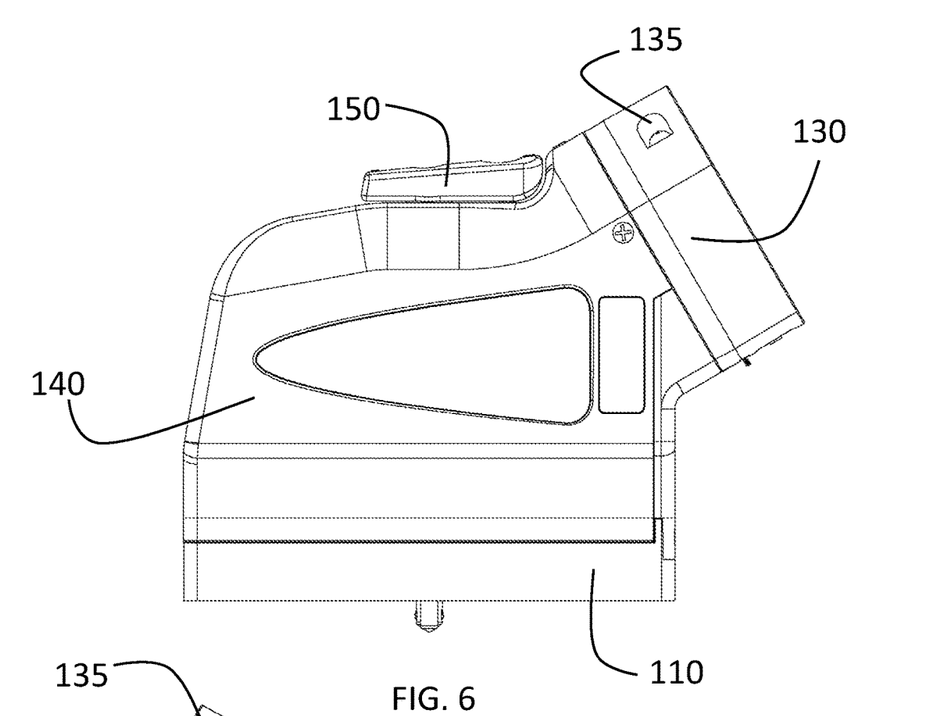
FIG. 6 is a left side view of a test adapter in accordance with a preferred embodiment of the present invention.
Figure 7:
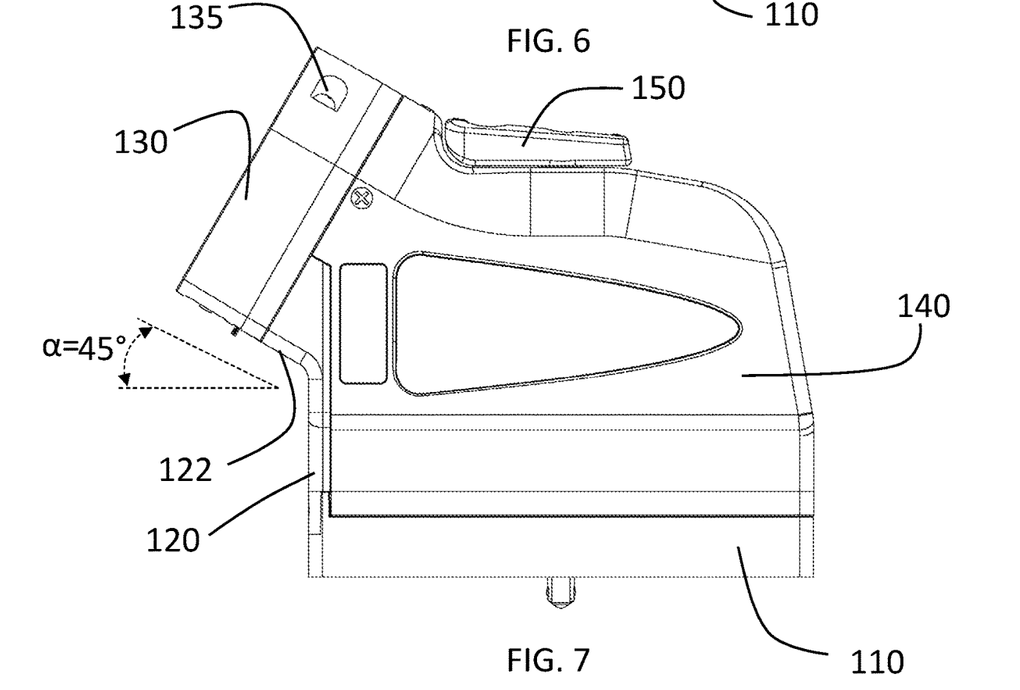
FIG. 7 is a right-side view of a test adapter in accordance with a preferred embodiment of the present invention.

As shown in FIG. 7, when collar support plate 120 is mounted to the frame 110, the neck 122 of the collar support plate 120 forms an angle α of 40-50° and preferably 45° with the plane of the face of the frame 110. Thus, when the collar 130 is mounted the collar support plate 120, the opening in the collar similarly is at an angle of 40-50° relative to the plane of the face of the frame 110. This angle of the collar allows for larger wires or bundles of wires to enter the test adapter through the opening in the collar and attach to pins in modules in the test adapter frame 110 than in prior systems.

The cover 140 has two open faces, one opposing the test adapter frame 110 and one opposing the collar support plate 120 when the cover is attached to the frame 110 and collar support plate 120. The edge on each of the two parallel sides of the open face of the cover opposing the test adapter frame 110 has a tongue or tongues 142 to mate with the grooves 110a in the frame 110. The two parallel sides of the open face of the cover opposing the collar support plate 120 each has a lip 140a for placement within a lip of the collar support plate 120 when the cover is placed onto the frame 110 and collar support plate 120. The cover further has a hole 144 through a stem 151 of a handle 150 extends to attach to an engagement mechanism.

The handle 150 may have markings for indicating whether the engagement mechanism 800 is in an open or closed position. The cover likewise may have a marking or markings to assist in indicate the open or closed position of the handle 150.

Figure 8:
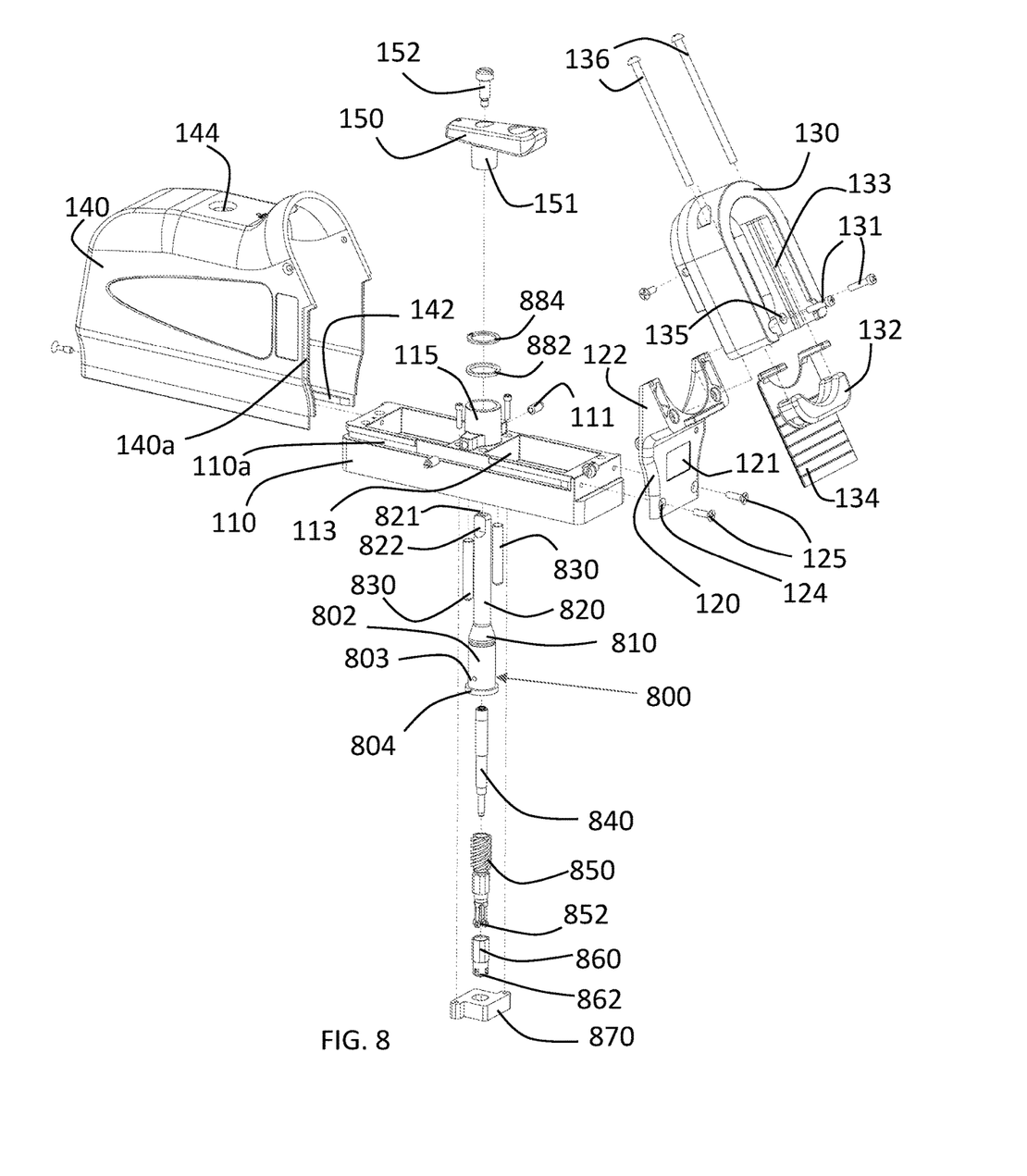
FIG. 8 is an assembly view of a test adapter in accordance with a preferred embodiment of the present invention.

The locking mechanism 800 is shown in more detail in FIG. 8. The locking mechanism 800 has a ring 810, a lead screw drive 802 and an elongated spring lock nut 820. The elongated spring lock nut 820 allows for a larger space within the cover 140 for accommodating larger wire bundles. The spring lock nut 820 has two opposing flats 822 that are used to transfer torque from the engagement handle 150 to the spring lock nut 820, a threaded hole 821 for a shoulder screw 152 that attaches the engagement handle 150 to the spring lock nut 820, and a shoulder 804 that positions the engagement mechanism 800 within the test adapter or ITA housing. There is a groove between ring 810 and lead screw drive 802 that is for a retaining ring or rings 882, 884 that positions the engagement mechanism 800 in the test adapter frame 110. Further, there are two ball plungers 111 that align with feature 803 to hold the handle 150 in the open position. The locking mechanism 800 further has a spring lock pin 860 and locking tabs 852. The locking tabs 862 are used to initially attach the test adapter assembly 100 to the receiver 200 by placement of the spring lock pin 860 with a blind mate alignment nose 862 into the receiving means 870 in the receiver. When so placed, the locking tabs 862 latch into means, such as a groove or ridge 140, within the receiving means 120 in the receiver.

After that initial attachment of the test adapter assembly 100 to the receiver 200, a multi start Acme lead screw 850 within the lead screw drive 820 provides a consistent, low torque means of engagement to draw the test adapter assembly 100 into the receiver 200 and complete the connections between contact pins in the receiver and in the test adapter.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto and their equivalents. The entirety of each of the aforementioned documents is incorporated by reference herein.

What is claimed is:

1. An interface device comprising:
   a test adapter assembly comprising:
   a test adapter frame having a first pair of opposing sides, a second pair of opposing sides and an engagement mechanism support member, said second pair of opposing sides being shorter than said first pair of opposing side, said first and second pairs of opposing sides forming a test adapter face; and
   a collar support member connected to said test adapter frame, said collar support member having a plate portion mounted to one of said second pair of opposing sides of said test adapter frame and a collar mounting portion extending from said plate portion at an angle of 40-50° relative to said face of said test adapter frame;
   a collar mounted to said collar mounting portion of said collar support member;
   a first cover mounted to said test adapter frame and said collar;
   a clamp movably mounted to said collar;
   a second cover slidingly mounted in said collar, said second cover being configured to cover a portion of the opening in the collar remaining open after said clamp is tightened in said collar to hold a wiring bundle in the test adapter; and an engagement mechanism mounted to said engagement mechanism support member in said test adapter frame, said engagement mechanism comprising:
   a spring lock nut;
   a lead screw drive comprising a housing having interior threads, an Acme lead screw in said housing, and a spring lock pin having at least one retractable locking tab; and
   a handle connected to said spring lock nut; and
a receiver comprising:
   a frame;
   a channel for receiving said spring lock pin; and
   means within said channel for engaging said at least one locking tab.

2. An interface device according to claim 1, wherein said collar mounting portion extending from said plate portion at an angle of 45° relative to said face of said test adapter frame.

3. An interface device according to claim 1 wherein said test adapter frame has a groove on each of said first pair of opposing sides and said first cover has a tongue for mating with said groove on each of said first pair of opposing sides of said test adapter frame.

4. An interface device according to claim 1 wherein said first cover has two open faces, a first open face opposing the test adapter frame and a second open face opposing the collar support plate, wherein said first cover is attached to both said test adapter frame and collar support plate.

5. An interface device according to claim 4, wherein an edge on each of two parallel sides of said open face of the first cover opposing the test adapter frame has a tongue mating with the groove on each of said first pair of opposing sides of said test adapter frame.

6. An interface device according to claim 4 wherein two parallel sides of the open face of the first cover opposing the collar support plate each has a lip for placement within a lip of the collar support plate when the cover is connected to the test adapter frame and the collar support plate.

\* \* \* \* \*